United States Patent [19]

Martin et al.

[11] 4,230,522

[45] Oct. 28, 1980

[54] PNAF ETCHANT FOR ALUMINUM AND SILICON

[75] Inventors: John E. Martin, Capistrano Beach; Wing P. Ng, Irvine, both of Calif.

[73] Assignee: Rockwell International Corporation, El Segundo, Calif.

[21] Appl. No.: 973,335

[22] Filed: Dec. 26, 1978

[51] Int. Cl.$^3$ .................. C09K 13/06; C09K 13/08; H01L 21/308

[52] U.S. Cl. ................................. 156/638; 156/656; 156/657; 156/659.1; 156/662; 156/665; 252/79.3; 252/79.4

[58] Field of Search ............... 156/656, 638, 345, 657, 156/662, 665, 659, 637; 242/79.3, 79.4

[56] References Cited

U.S. PATENT DOCUMENTS

| 3,052,582 | 9/1962 | Snyder | 156/664 |
|---|---|---|---|
| 3,448,055 | 7/1969 | Mickelson et al. | 252/79.3 |
| 3,457,107 | 7/1969 | Mickelson et al. | 252/79.4 |
| 3,514,407 | 5/1970 | Missel | 252/79.3 |
| 3,524,817 | 8/1970 | Roy et al. | 252/79.3 |
| 3,645,790 | 2/1972 | Burden et al. | 252/79.4 |
| 3,677,848 | 7/1972 | Stoller et al. | 156/638 |
| 3,715,250 | 2/1973 | Altman et al. | 252/79.4 |
| 3,825,454 | 7/1974 | Kikuchi et al. | 156/656 |
| 3,833,434 | 9/1974 | Kikuchi et al. | 156/638 |
| 3,859,222 | 1/1975 | Squillace et al. | 252/79.3 |
| 3,881,971 | 5/1975 | Greer et al. | 156/662 |
| 3,994,817 | 11/1976 | Quintana | 252/79.3 |
| 4,022,930 | 5/1977 | Fraser | 156/656 |
| 4,080,246 | 3/1978 | Battisti | 252/79.2 |
| 4,125,426 | 11/1978 | Inayoshi et al. | 156/657 |

OTHER PUBLICATIONS

Haruilchuck et al., "Metal Etchant" IBM Technical Disclosure Bulletin, vol. 15, No. 9 (2/73) p. 2985.

Primary Examiner—Jerome W. Massie
Attorney, Agent, or Firm—H. Fredrick Hamann; Gilbert H. Friedman

[57] ABSTRACT

A chemical etchant and a process for chemically etching thin films of aluminum, silicon, and aluminum-silicon alloy on composite structures which may be, for example, integrated circuit devices. The etching process utilizes a mixture of phosphoric acid, nitric acid, acetic acid, a fluoroborate anion containing compound such as fluoroboric acid for providing fluoride ions, a surfactant, and water. This PNAF etchant may be used in fabricating a wafer of integrated circuit devices without lifting photoresist maskant thereon. The formulation provides relatively rapid dissolution of silicon as compared to its etch rates for silicon oxide and silicon nitride. In addition, the etchant has been found suitable for relatively long term use in a production environment.

13 Claims, No Drawings

4,230,522

PNAF ETCHANT FOR ALUMINUM AND SILICON

BACKGROUND OF THE INVENTION

1. Field of the Invention

This invention relates to metallization procedures used in the manufacture of semiconductor integrated circuits.

2. Description of the Prior Art

Metallization patterns for integrated circuits are typically formed of aluminum, aluminum-silicon alloy or silicon. It is known that aluminum and silicon are soluble in each other to a certain extent. When aluminum for the metallization is deposited on the silicon semiconductor material, dissolution of the silicon into the aluminum may be sufficient to pit the silicon. In addition, aluminum alloying through pn junctions in the vicinity of the aluminum contact causes leaky junctions. Either of these effects is unacceptable in many cases. The use for the metallization of an aluminum-silicon alloy, typically having from less than one percent to about three percent of silicon therein, greatly reduces the propensity of the two materials to alloy further.

Etchants which etch aluminum primarily are not sufficient in the cases where metallization for the integrated circuits is aluminum-silicon alloy or silicon. Conductive material may remain on the wafer and form bridges between adjacent conductor lines. These bridges are due to uneven etching. The bridges may form short-circuits. It is desirable, therefore, to use an etchant which efficiently removes both aluminum and silicon in forming integrated circuit metallization patterns.

PNAF etchants for forming aluminum, aluminum-silicon alloy and silicon metallization patterns on integrated circuit wafers are disclosed in Kikuchi et al, U.S. Pat. No. 3,825,454 entitled "Method of Forming Interconnections" and in Fraser, U.S. Pat. No. 4,022,930 entitled "Multilevel Metallization for Integrated Circuits". Fluoride ions for dissolving oxides of silicon are provided in the etchants of these references by ammonium fluoride ($NH_4F$).

It is believed that ammonium fluoride generates hydrofluoric acid (HF) when in equilibrium with strong acids such as nitric acid. Nitric acid is used in the etchants disclosed in the referenced patents to oxidize silicon. Hydrofluoric acid is known to be a strong etchant for silicon oxide. Therefore, it is relatively difficult to control a production etching facility using the PNAF etchants disclosed in the two patents referenced above. Not only do those etchants dissolve silicon, they also readily and vigorously dissolve the silicon oxide or silicon nitride which frequently forms a required layer of dielectric material beneath the metallization pattern being formed on the wafer. It the underlying silicon oxide or silicon nitride layer is unduly thinned or etched through, electrical performance of the resulting devices is likely to be seriously degraded. Therefore, it is desirable to use an etchant and etching process for the metallization which reduces the rate at which silicon oxide and silicon nitride are dissolved. Such an etchant would also preferably increase the rate at which silicon is dissolved relative to the rate of dissolution of silicon oxide and silicon nitride.

Another difficulty exists in using the PNAF etchants disclosed in the above-referenced patents. The etch rates produced thereby do not remain sufficiently constant for a sufficiently long period of time to be used conveniently in a production mode and environment. With large numbers of parts being processed through a particular etching bath of a reasonable size, one or more of the active species in the bath will eventually become depleted. Etch rates will diminish due to this depletion. Unless etch times or temperature or both are adjusted, specified results may not be obtained. But a requirement for adjusting etch times and temperatures in a production environment introduces undesirable complexity into the operation. In the case of the prior-art PNAF etchants, it is the depletion of the available fluoride ions ($F^-$) which tends to cause changes in the performance of the etchant. It is desirable, therefore, to use an etchant and etching process for the aluminum, aluminum-silicon alloy and silicon wherein the etchant, in reasonable quantities, tends to retain its etching properties relatively constant over a convenient period of time such as, for example, an eight-hour shift.

SUMMARY OF THE INVENTION

It is an object of the present invention to provide an etchant and an etching process for forming aluminum, aluminum-silicon alloy, and polysilicon metallization patterns on integrated circuit devices wherein the rate at which silicon is dissolved by the etchant is increased relative to the rates at which silicon oxide and silicon nitride are dissolved by the etchant and etching process.

It is an additional object of the present invention to provide an etchant and an etching process for forming aluminum, aluminum-silicon alloy and polysilicon metallization patterns on integrated circuit devices wherein the etchant retains its etching properties relatively constant while being used in a production mode and environment over an eight-hour shift.

It is a feature of this invention that the primary fluoride ion providing species in the etchant is a fluoroborate anion containing compound such as, for example, fluoroboric acid.

The above-listed objects and other objects of the invention are provided by an aqueous mixture including from about 10 to about 50 parts by volume of orthophosphoric acid (85%), from about 0.1 to about 5 parts by volume of nitric acid (70%), from about 2 to about 12 parts by volume of glacial acetic acid, from about 0.3 to about 3 parts by volume of a tetrafluoroborate anion containing compound such as, for example, tetrafluoroboric acid (48%), from about 2 to about 1500 parts per million by volume of a surfactant, and from zero to about 10 parts by volume of water.

The etchant of the invention is used in a process for dissolving thin films of aluminum, aluminum-silicon alloy and silicon. The etchant is maintained at a temperature from about 20° C. to about 60° C.

In a typical operation, the areas of the composite to be etched are defined by a mask layer of photoresist material commonly used in conventional photolithographic techniques. This mask material is provided on the top surface of a layer of aluminum, aluminum-silicon alloy or polysilicon. Openings in the mask are formed by standard techniques. The composite structure with the formed openings is placed in the PNAF etchant mixture which has been previously heated to an elevated temperature of preferably about 40° C. for etching silicon. While in the etchant, the composite structure is preferably agitated to permit hydrogen bubbles to escape thereby promoting uniformity of etching. The composite structure is kept in the heated PNAF etchant mixture for a time sufficient to remove all of the aluminum, aluminum-silicon alloy or silicon not protected by maskant. The mask remains intact on the composite structure. If a subsequent inspection reveals aluminum, silicon, or aluminum-silicon alloy remaining in the mask opening areas, the structure may be returned to the PNAF etchant bath for removal of the residue. The original mask is maintained in place for this post-inspection etch.

DESCRIPTION OF THE PREFERRED EMBODIMENTS

The PNAF etchant for thin films of aluminum, aluminum-silicon alloy and silicon provided by this invention is an aqueous mixture having from about 10 to about 50 parts by volume of concentrated (85%) orthophosphoric acid ($H_3PO_4$), from about 0.1 to about 5 parts by volume of concentrated (70%) nitric acid ($HNO_3$) from about 2 to about 12 parts by volume of glacial acetic acid (HOAc or $CH_3COOH$), from about 0.3 to about 3 parts by volume of concentrated (48%) tetrafluoroboric acid ($HBF_4$), between about 2 and about 1500 parts per million by volume of a surfactant, and from zero to about 10 parts by volume of water.

The nitric acid is an oxidizing agent for silicon. If the nitric acid concentration in the etchant is made too high, the photoresist maskant on the semiconductor wafers for defining the areas to be etched will be attacked and the maskant may be lifted. If the nitric acid concentration in the etchant is too diluted, the oxidation and etch rate for silicon will be too small. Alternative oxidizing agents which may be substituted for nitric acid in the etchant include permanganate anion containing salts, bismate anion containing salts and chromic acid.

The phosphoric acid reacts with and dissolves aluminum. Also, the phosphoric acid and the acetic acid together act as diluting agents and leveling agents for reducing the reactive power of the nitric acid and the fluoride containing constituent and for bringing the active species to some common form and concentration. If the amounts of phosphoric acid and acetic acid in the etchant mixture are insufficient, photoresist maskant will be attacked and tend to be lifted from the surfaces it is intended to protect. An alternative to the acetic acid for a diluting and leveling agent in the etchant is fluoroacetic acid.

The fluoroboric acid in the etchant provides fluoride anions for dissolving the oxides of silicon obtained from the reaction between silicon and the nitric acid, as desired, and also for undesired dissolving of silicon oxide and silicon nitride from the dielectric layers already formed on the semiconductor wafer as part of the integrated circuit devices. An insufficient concentration of fluoride anion containing species causes the etch rate for silicon to be too low. An excess concentration of fluoride anion containing species causes the etch rate for a silicon oxide or silicon nitride dielectric layer underlying the metallization film to be too high.

In the etchant solution, the preponderance of fluoride anions are bound or complexed wih cations of boron in fluoroborate anions and are unavailable for causing dissolution of silicon oxide. The ionization constants for the fluoroborate anion are such that a controlled or metered disassociation of the fluoride anions from the fluoroborate anions occurs in the etchant solution. It is this relatively constant rate of release of fluoride anions which gives the etchant of the invention its quality of providing relatively constant etch rates for silicon and silicon oxide over a relatively long interval of time such as, for example, an eight-hour shift. This controlled release of fluoride anions also gives the etchant of the invention its quality of providing an etch rate for silicon oxide which is relatively low relative to its etch rate for silicon.

As has been indicated, the preferred fluoroborate anion containing compound is fluoroboric acid. However, other sources of the fluoroborate anion such as, for example, ammonium fluoroborate or the fluoroborate salt of an alkali metal such as sodium fluoroborate may be used for this purpose.

Suitable surfactants for use in this invention are, for example, the anionic perfluorocarboxylic acid surfactants. Of these, the preferred surfactant is made and sold under the trademark FC-93 by the 3M Company of Minneapolis. Minn. As alternatives, a polyethoxylated alcohol surfactant such as, for example, Triton X-100 made and sold by Rohm and Haas Company of Philadelphia, Pa., is suitable. A surfactant such as these reduces the surface tension of the etchant. Wetting of the surfaces of the parts to be etched is thereby facilitated. As a consequence, bubbles of gas which tend to form during etching are less likely to adhere to the surfaces. Thus, more uniform etching and a reduction in the probability of forming short-circuiting bridges results.

A preferred composition for the PNAF etchant in accordance with this invention is the mixture including about 24 parts (from 20 to 28 parts) by volume of concentrated (85%) orthophosphoric acid, about 1 part (from 0.8 to 1.2 parts) by volume of concentrated (70%) nitric acid, about 5 parts (from 4 to 6 parts) of glacial acetic acid, about 1 part (from 0.8 to 1.2 parts) by volume of concentrated (48%) tetrafluoroboric acid, about one hundred parts (from 50 to 150 parts) per million by volume of anionic perfluorocarboxylic acid surfactant, and about 2 parts (1 to 3 parts) by volume of water. This etchant is preferably used at 40° C. for etching silicon. The wafers being etched are preferably agitated while in the etchant to aid in the release of bubbles from their surfaces.

EXAMPLE 1

For comparison purposes, etching rate tests were conducted using a prior-art PNAF etchant in which the sources of fluoride ions were ammonium fluoride and hydrofluoric acid. The etchant included concentrated (85%) orthophosphoric acid, concentrated (70%) nitric acid, glacial acetic acid, concentrated (40%) ammonium fluoride, concentrated (49%) hydrofluoric acid, FC-93 surfactant, and water in the following proportions by volume, respectively: 24, 1, 5, 0.28, 0.05, 100 ppm, and 2. The relative proportions of the constituents of this etchant are the same as in the preferred etchant of the invention except for the fluoride anion providing compounds. The concentration of fluoride anion containing species in this mixture is less than is disclosed for the etchants discussed in the patents issued to Kikuchi et al and to Fraser as referenced hereinabove. The following etch rates were obtained at a temperature of 45° C. and without any agitation.

| Material | Etch Rate | Ratio of Polysilicon Etch Rate to Material Etch Rate |
|---|---|---|
| Polysilicon | 140 Å/Minute | 1 |

| Material | Etch Rate | Ratio of Polysilicon Etch Rate to Material Etch Rate |
|---|---|---|
| Dry Thermal Silicon Oxide | 100 Å/Minute | 1.4 |
| Silicon Nitride | 4 Å/Minute | 35 |
| 6-8% Phosphorus doped, densified silox | 329 Å/Minute | 0.43 |

As has been indicated, the higher the ratio of the etch rate for the polysilicon to the etch rate for another of the materials, the more suitable is the etchant for use in producing integrated circuits.

EXAMPLE 2

In another test, the preferred etchant according to the invention was tested at 45° C. without any agitation. The etchant included concentrated (85%) orthophosphoric acid, concentrated (70%) nitric acid, glacial acetic acid, concentrated (48%) tetrafluoroboric acid, FC-93 surfactant, and water in the following proportions by volume, respectively: 24, 1, 5, 1, 100 ppm, and 2. The following etch rates were observed:

| Material | Etch Rate | Ratio of Polysilicon Etch Rate to Material Etch Rate |
|---|---|---|
| Polysilicon | 280 Å/Minute | 1 |
| Dry Thermal Silicon Oxide | 34 Å/Minute | 8.2 |
| Silicon Nitride | 3.4 Å/Minute | 82 |
| 6-8% Phosphorus Doped, Densified Silox | 545 Å/Minute | 0.51 |

The performance of this etchant is appreciably improved over the prior-art etchant of Example 1 with respect to the polysilicon etch rate relative to the etch rates for the silicon oxide, silicon nitride and the silox. The absolute etch rate for polysilicon provided by this etchant is regarded as more favorable than etch rates for polysilicon obtained with lower proportions of fluoroboric acid. In a similar test of this etchant on pure aluminum, an etch rate of about 1 micron in 3.5 minutes, or about 2900 angstroms per minute, was obtained. In factory tests of this preferred etchant, no evidence of resist lifting was observed. The metal line definition remained sharp.

The etch rate obtained for pure aluminum, as stated above, is faster than is desirable for use in a production mode. This fast etch rate makes a production process difficult for an operator to control. It is anticipated that the preferred etchant will be more suitable for production mode etching of aluminum at lower temperatures, e.g., in the range from about 30° C. to about 35° C. provided the etching bath is held at a pressure below atmospheric pressure to reduce bubble formation.

To date, the preferred etchant has been used by the inventors herein in a production mode defreckle operation. A defreckle operation is typically used to remove residual silicon and aluminum left behind after etching aluminum-silicon alloy in an etchant designed primarily for the dissolution of pure aluminum. In the defreckle operations, the parts are typically in contact with the preferred etchant for a period of time in the range from about 30 seconds to about one minute.

EXAMPLE 3

In still another test, another etchant according to the invention was tested at 45° C. and without any agitation. The proportion of fluoroboric acid in this etchant was one-third of that in the preferred etchant of Example 2. The following etch rates were observed:

| Material | Etch Rate | Ratio of Polysilicon Etch Rate to Material Etch Rate |
|---|---|---|
| Polysilicon | 117 Å/Minute | 1 |
| Dry Thermal Silicon Oxide | 30 Å/Minute | 3.9 |
| Silicon Nitride | 1 Å/Minute | 117 |
| 6.8% Phosphorus Doped, Densified Silox | 383 Å/Minute | 0.31 |

The performance of this etchant is improved over the preferred etchant of Example 2 with respect to the polysilicon etch rate relative to the etch rate for the silicon nitride only. In factory tests of this etchant, no evidence of resist lifting was observed. The metal line definition remained sharp.

EXAMPLE 4

The preferred PNAF etchant of Example 2 was tested again. Four sets of tests were conducted at temperatures in the range from about 42° C. to about 45.5° C. The primary difference in this example is that the parts being etched were agitated.

| | Material | Average Etch Rate | Ratio of Polysilicon Etch Rate to Material Etch Rate |
|---|---|---|---|
| Set 1 | Polysilicon | 1571 Å/Minute | 1 |
| | 6-8% Phosphorus Doped, Densified Silox | 1064 Å/Minute | 1.48 |
| Set 2 | Polysilicon | 763 Å/Minute | 1 |
| | 6-8% Phosphorus Doped, Densified Silox | 1318 Å/Minute | 0.58 |
| Set 3 | Polysilicon | 836 Å/Minute | 1 |
| | 6-8% Phosphorus Doped, Densified Silox | 1122 A/Minute | 0.75 |
| Set 4 | Polysilicon | 883 Å/Minute | 1 |
| | 6-8% Phosphorus Doped, Densified Silox | 1548 Å/Minute | 0.57 |

The first set of data appears anomalous. The remaining data indicate that agitation increases the absolute etch rates while the etch rate of polysilicon relative to the etch rate for silox remains relatively constant.

EXAMPLE 5

The preferred etchant was tested again on polysilicon at temperatures between 43° C. and 44° C. and without agitation. An etching rate of 351 Å/Minute was obtained. This is approximately the same etch rate on polysilicon as was obtained in Example 2. Thus, Examples 2 and 5 corroborate each other.

EXAMPLE 6

Still another PNAF etchant according to the invention was tested which included concentrated (85%) orthophosphoric acid, concentrated (70%) nitric acid, glacial acetic acid, concentrated (48%) tetrafluoroboric acid, and water. These are the same constituents as in the preferred etchant of Example 2 except for the surfactant which was omitted. The above-listed constituents were present in this etchant in the following proportions by volume, respectively: 14, 1, 5, 0.32, and 2. The phosphoric acid and fluoroboric acid here are reduced below their proportions in the preferred etchant of Example 2. A set of tests was conducted at temperatures in the range from about 42° C. to 45° C. The parts being etched were agitated. No appreciable etching of silicon occurred in 30 seconds.

| Material | Average Etch Rate | Ratio of Polysilicon Etch Rate to Material Etch Rate |
|---|---|---|
| Polysilicon | 0 | 1 |
| 6–8% Phosphorus Doped, Densified Silox | 293 Å/Minute | 0 |

EXAMPLE 7

An additional etchant according to the invention was tested which included concentrated (85%) orthophosphoric acid, concentrated (70%) nitric acid, glacial acetic acid, concentrated (48%) tetrafluoroboric acid, and water. These are the same constituents as in the preferred etchant of Example 2 except for the surfactant which was omitted. The above-listed constituents were present in this etchant in the following proportions by volume, respectively: 29, 5, 5, 0.32, and 2. The phosphoric acid and nitric acid here are increased above their proportions in the preferred etchant of Example 2. The fluoroboric acid is reduced below its proportion in the preferred etchant of Example 2. Three sets of tests were conducted at temperatures in the range from about 42° C. to 45.5° C. The parts being etched were agitated.

| | Material | Average Etch Rate | Ratio of Polysilicon Etch Rate to Material Etch Rate |
|---|---|---|---|
| Set 1 | Polysilicon | 335 Å/Minute | 1 |
| | 6–8% Phosphorus Doped, Densified Silox | 137 Å/Minute | 2.45 |
| Set 2 | Polysilicon | 263 Å/Minute | 1 |
| | 6–8% Phosphorus Doped, Densified Silox | 330 Å/Minute | 0.80 |
| Set 3 | Polysilicon | 182 Å/Minute | 1 |
| | 6–8% Phosphorus Doped, Densified Silox | 145 Å/Minute | 1.26 |

The indications in data sets 1 and 3 that silox is etching slower than polysilicon is contrary to the general experience with these etchant types. Therefore, the data of this example is believed to be inconclusive.

EXAMPLE 8

A simulated production mode test of the preferred etchant of Example 2 was conducted at 43° C. and without agitation. A total of ten wafers were etched in a 250 milliliter etchant bath over a period of six and one-half hours. This is roughly equivalent to etching a total of about 150 wafers in a two-gallon etchant bath. In actual practice, this preferred etchant has been used and has performed satisfactorily in a two-gallon etchant bath for defreckle operations operating in a production mode and processing about 500 wafers per hour for an eight-hour shift without requiring a change in the etchant or etching conditions. The following etch rates were observed:

| | Initial Etch Rate Å/Minute | Etch Rate Ratio | Final Etch Rate Å/Minute | Etch Rate Ratio | Etch Rate Reduction |
|---|---|---|---|---|---|
| Polysilicon | 288 | 1 | 226 | 1 | 22% |
| Doped, Densified Silox | 407 | 0.71 | 364 | 0.62 | 11% |
| Aluminum | 2500 | 0.12 | — | — | — |

The initial etch rates obtained are about the same as were obtained for this etchant in Example 2. The final etch rates were obtained after the etchant was allowed to stand for the six and one-half hour period and after etching the two-gallon equivalent of about 150 wafers. The preferred etchant according to the invention tested here showed greater stability in its etch rate for silox than was exhibited by the prior-art etchant tested in Example 9 and greater stability in both its etch rate for polysilicon and for silox than was exhibited by the prior-art etchant tested in Example 10. The wafers processed in the tests of Examples 8, 9 and 10 had patterns of photoresist maskant thereon. The wafers processed in this preferred etchant test exhibited about 15 microinches of maskant undercut per side after etching for about two minutes. This is considerably less than the maskant undercut experienced in the tests of the two prior-art etchants for which test results are given in Examples 9 and 10 below.

EXAMPLE 9

A simulated production mode test, as in Example 8, was conducted using one of the prior-art PNAF etchants disclosed in the above-referenced patent issued to Kikuchi et al. The etchant used comprised a mixture of concentrated phosphoric acid (85%), glacial acetic acid, water, concentrated ammonium fluoride (40%) and concentrated nitric acid (70%) in the proportions of 76:15:5:2:3, respectively. The following etch rates were observed:

| | Initial Etch Rate Å/ Minute | Etch Rate Ratio | Final Etch Rate Å/ Minute | Etch Rate Ratio | Etch Rate Reduction |
|---|---|---|---|---|---|
| Polysilicon | 144 | 1 | 126 | 1 | 13% |
| Doped, Densified Silox | 309 | 0.47 | 214 | 0.59 | 31% |
| Aluminum | 3500 | 0.04 | — | — | — |

The wafers processed in this prior-art etchant exhibited about 50 microinches of maskant undercut per side after etching for about two minutes.

EXAMPLE 10

Still another simulated production mode test, as in Example 8, was conducted using another of the prior-art PNAF etchants disclosed in the above-referenced patent issued to Kikuchi et al. The etchant used comprised a mixture of concentrated phosphoric acid (85%), glacial acetic acid, water, concentrated ammonium fluoride (40%), and concentrated nitric acid (70%) in the proportions of 76:15:5:4:3, respectively. This is twice the proportion of ammonium fluoride as was used in the etchant test in Example 9. The following etch rates were observed:

|  | Initial Etch Rate Å/ Minute | Etch Rate Ratio | Final Etch Rate Å/ Minute | Etch Rate Ratio | Etch Rate Reduction |
|---|---|---|---|---|---|
| Polysilicon Doped, | 413 | 1 | 271 | 1 | 34% |
| Densified Silox | 726 | 0.57 | 530 | 0.51 | 27% |
| Aluminum | 3000 | 0.14 | — | — | — |

The wafers processed in this prior-art etchant exhibited about 75 microinches of maskant undercut per side after etching for about two minutes.

While the invention has been described with respect to the preferred embodiment thereof, it will be understood by those skilled in the art that various changes in form and details may be made therein without departing from the spirit and scope of the invention.

What is claimed is:

1. A method of forming a pattern of interconnections on an integrated circuit substrate, comprising:
   forming a thin film layer of metallization on said substrate;
   forming a layer of maskant on said layer of metallization;
   patterning said layer of maskant according to said interconnections; and
   etching said layer of metallization with an etchant including:
   between about 20 and about 28 parts by volume of 85% concentrated orthophosphoric acid $(H_3PO_4)$;
   between about 0.8 and about 1.2 parts by volume of 70% concentrated nitric acid $(HNO_3)$;
   between about 4 and about 6 parts by volume of glacial acetic acid (HOAc); and
   between about 0.8 and about 1.2 parts by volume of a 48% concentrated tetrafluoroborate anion containing $(BF_4^-)$ material.

2. The method recited in claim 1 further comprising maintaining the temperature of said etchant substantially constant at a temperature in the range from about 30° C. to about 50° C.

3. The method recited in claim 2 further comprising agitating said substrate while said substrate is immersed in said etchant.

4. The method recited in claim 2 further comprising holding said etchant at a pressure below atmospheric pressure to reduce bubble formation.

5. The method recited in claim 2 further comprising using said etchant in applications wherein said maskant is a positive photoresist and in applications wherein said maskant is a negative photoresist.

6. The method recited in claim 1 wherein said layer of metallization is of a material selected from the group consisting of aluminum, aluminum-silicon alloy and silicon.

7. An etchant for aluminum, aluminum-silicon alloy and silicon, comprising:
   between about 20 and about 28 parts by volume of 85% concentrated orthophosphoric acid $(H_3PO_4)$;
   between about 0.8 and about 1.2 parts by volume of 70% concentrated nitric acid $(HNO_3)$;
   between about 4 and about 6 parts by volume of glacial acetic acid (HOAc); and
   between about 0.8 and about 1.2 parts by volume of a 48% concentrated tetrafluoroborate anion $(BF_4^-)$ containing material.

8. The etchant recited in claim 7 at a temperature in the range from about 30° C. to about 50° C.

9. The etchant recited in claim 8 wherein said tetrafluoroborate anion containing material is selected from the group consisting of tetrafluoroboric acid $(HBF_4)$, ammonium fluoroborate $(NH_4BF_4)$ and a fluoroborate salt of an alkali metal.

10. The etchant recited in claim 8, further comprising between about 2 and about 1,500 parts per million of an anionic surfactant.

11. The etchant recited in claim 10 wherein said anionic surfactant is selected from the group consisting of perfluorocarboxylic acid and polyethoxylated alcohol surfactants.

12. The etchant recited in claim 8, further comprising between zero and about 10 parts by volume of water.

13. An etchant for aluminum, aluminum-silicon alloy and silicon, comprising:
   about 24 parts by volume of 85% concentrated orthophosphoric acid $(H_3PO_4)$;
   about 1 part by volume of 70% concentrated nitric acid $(HNO_3)$;
   about 5 parts by volume of glacial acetic acid (HOAc); and
   about 1 part by volume of a 48% concentrated tetrafluoroborate anion $(BF_4^-)$ containing material.

* * * * *